United States Patent [19]

Bilgrien

[11] Patent Number: 5,399,650

[45] Date of Patent: Mar. 21, 1995

[54] ADHESION PROMOTING ADDITIVES AND LOW TEMPERATURE CURING ORGANOSILOXANE COMPOSITIONS CONTAINING SAME

[75] Inventor: Carl J. Bilgrien, Midland, Mich.

[73] Assignee: Dow Corning Corporation, Midland, Mich.

[21] Appl. No.: 107,495

[22] Filed: Aug. 17, 1993

[51] Int. Cl.$^6$ .............................................. C08G 77/06
[52] U.S. Cl. .................................. 528/15; 528/31; 528/32; 528/34; 556/446; 556/445
[58] Field of Search .................. 556/446, 445; 528/15, 528/31, 32, 34

[56] References Cited

U.S. PATENT DOCUMENTS

| | | | |
|---|---|---|---|
| 4,243,718 | 1/1981 | Murai et al. | 428/411 |
| 4,719,262 | 1/1988 | Plueddemann | 525/105 |
| 4,732,932 | 3/1988 | Waldern | 524/862 |
| 4,786,701 | 11/1988 | Tanaka | 528/15 |
| 4,891,393 | 1/1990 | Hirai et al. | 523/212 |
| 4,912,188 | 3/1990 | Colas et al. | 528/15 |
| 5,023,288 | 6/1991 | Hirai et al. | 524/268 |
| 5,082,894 | 1/1992 | VanWert et al. | 524/730 |
| 5,106,933 | 4/1992 | Kobayashi et al. | 528/15 |
| 5,270,425 | 12/1993 | VanWert et al. | 528/15 |

FOREIGN PATENT DOCUMENTS

| | | |
|---|---|---|
| 1287434 | 9/1987 | Canada . |
| 240333 | 10/1987 | European Pat. Off. . |
| 460698 | 12/1991 | European Pat. Off. . |
| 52-13454 | 3/1977 | Japan . |
| 1503369 | 11/1989 | Japan . |

*Primary Examiner*—John C. Bleutge
*Assistant Examiner*—Margaret W. Glass
*Attorney, Agent, or Firm*—Robert Spector

[57] ABSTRACT

Adhesion promoting additives for organosiloxane compositions that cure by a platinum-catalyzed hydrosilation reaction are reaction products of (1) an ethylenically unsaturated ether of a polyfunctional alcohol and (2) at least one silicon compound selected from the group consisting of (i) epoxy-substituted organosilicon compounds containing at least one hydrolyzable group per molecule and (ii) tetraalkyl orthosilicates, also referred to tetraalkoxysilanes, where the reaction is conducted in the presence of a suitable catalyst such as an organotitanium compound. The additive optionally includes a chelated organoaluminum compound.

16 Claims, No Drawings

ADHESION PROMOTING ADDITIVES AND LOW TEMPERATURE CURING ORGANOSILOXANE COMPOSITIONS CONTAINING SAME

BACKGROUND OF THE INVENTION

1. Field of the Invention

This invention relates to organosiloxane compositions that cure by a platinum-catalyzed hydrosilation reaction. More particularly this invention relates to pre-reacted combinations of additives that improve the adhesion of these organosiloxane compositions to a variety of substrates, including metals and plastics, at curing temperatures below 100° C.

The curing characteristics of organosiloxane compositions that cure by a platinum-catalyzed hydrosilation reaction and the properties of the cured materials obtained from these compositions are desirable for a variety of end use applications, particularly in the electrical and electronics areas, The cured materials are useful as protective coatings, potting materials and encapsulants for integrated circuits and other electronic devices and as coatings for printed circuit boards.

A shortcoming of organosiloxane compositions that cure by a hydrosilation reaction is their inability to adhere strongly to many substrates, particularly plastics and certain metals. One method for remedying this deficiency is by the use of primer compositions or adhesion promoting additives containing silanes and organosiloxanes with a plurality of silicon-bonded hydrolyzable groups and at least one organofunctional substituent that is bonded to silicon through at least one carbon atom. Primer compositions are applied to substrates to which adhesion is desired prior to application of the curable organosiloxane composition. Adhesion promoters are present in the curable organosiloxane composition.

Examples of hydrolyzable groups that are present in known adhesion-promoting organosilicon compounds are alkoxy, carboxy such as acetoxy, ketoximo such as methylethyl ketoximo, and amido. The organofunctional group is typically one that will react with the substrate to which adhesion is desired. Examples of suitable organofunctional groups include but are not limited to alkenyl such as vinyl and allyl, aminoalkyl, epoxyalkyl, mercaptoalkyl and (meth)acryloxyalkyl.

Three classes of silanes frequently used as adhesion promoting additives are epoxy-functional silanes such as 3-glycidoxypropyltrialkoxysilanes, alkenyl-functional silanes such as vinyltrialkoxysilanes and alkyl silicates such as tetraethyl orthosilicate. These silanes can be at least partially replaced by their hydrolysis/condensation products.

European Patent Application No. 240,333 describes organic or silicone resin compositions containing up to 100 weight percent, based on the weight of the resin, of particles obtained by curing an organosiloxane composition containing an alkoxy substituted silane such as 3-glycidoxypropyltrimethoxysilane and an aluminum or zirconium compound.

The use of organic or organosilicon compounds containing epoxy groups in combination with an organic aluminum compound as an adhesion promoter for organosiloxane compositions that cure by a platinum catalyzed hydrosilation reaction is taught in Japanese Patent No. 1,503,369.

The use of an organosilicon compound selected from bis(trialkoxysilyl)alkanes, disilanes containing silicon-bonded alkoxy groups and epoxy-functional alkoxysilanes in combination with a zirconium compound is claimed in European Patent Application No. 493,791, published on Feb. 1, 1993.

The following references teach using two or more organofunctional groups other than alkoxy to achieve cohesive bonding between silicone elastomers cured by a platinum-catalyzed hydrosilation reaction and various substrates. These organofunctional groups can be present on the same or different organosilicon compounds.

The combination of (1) a polyorganosiloxane containing at least one hydroxyl group and at least one vinyl radical and (2) an epoxy-functional silane is taught in U.S. Pat. No. 4,087,585 that issued to Schulz on May 2, 1978. This patent also discloses the necessity of heating curable compositions containing this adhesion promoter to temperatures of at least 100 degrees C. to overcome the inhibiting effect of the adhesion promoter on the curing reaction. The ingredients of the adhesion promoter are blended directly with the other ingredients of the curable composition. The adhesion promoter also extends the working time of the curable composition Combining the adhesion promoting ingredients of the Schulz patent with a vinyltrialkoxysilane and a chelated organic aluminum compound is taught in commonly assigned U.S. application Ser. No. 980,078, filed on Nov. 23, 1992, now U.S. Pat. 5,270,425.

U.S. Pat. No. 4,732,932, which issued to A. Waldern on Mar. 22, 1988 teaches using as the adhesion promoter a silane containing an epoxy group, at least one alkoxy group and an ethylenically unsaturated hydrocarbon or hydrocarbonoxy radical.

Primers containing an organosilicon compound with aliphatic unsaturated bonds, an epoxy-containing silane and a vinyl acetate polymer are described in U.S. Pat. No. 4,243,718.

The use of polyorganosiloxanes containing an epoxy group and an ethylenically unsaturated hydrocarbon radical as an adhesion promoter for organosiloxane compositions that cure by a hydrosilation reaction is taught in U.S. Pat. No. 4,912,188, which issued to A. Colas et al. on Mar. 27, 1990 and U.S. Pat. No. 4,891,393, which issued to K. Hirai et al. on Jan. 2, 1990. The adhesion promoters of U.S. Pat. No. 4,912,188 were prepared by reaction of an organohydrogensiloxane/diorganosiloxane copolymer with 1) a silane containing an epoxy group and 2) a diene.

Published European Application No. 460,698, published on Dec. 11, 1991, describes organohydrogensiloxanes containing silicon-bonded epoxy groups as adhesion promoters. U.S. Pat. No. 5,082,894, which issued on Jan. 21, 1992, describes similar compositions containing an acetylenic alcohol with at least eight carbon atoms as the catalyst inhibitor and, as the adhesion promoter an alkoxysilane containing an epoxy group and a polyorganosiloxane containing an average of at least one silicon-bonded hydroxyl group and at least one vinyl radical per molecule.

U.S. Pat. No. 4,719,262, which issued on Jan. 12, 1988 to Edwin Plueddemann teaches using reaction products of (1) allyl-substituted organic compounds, including allyl ethers of polyfunctional alcohols and (2) either silanes or disilylalkanes containing at least two alkoxy groups per molecule as adhesion promoting additives or primers. The alkoxy substituted organosilicon compounds do not contain any organofunctional groups.

U.S. Pat. No. 5,106,933 describes adhesion promoters consisting of at least two of (1) an organosilicon compound containing at least one (meth)acryloxyalkyl group, (2) an organosilicon compound containing at least one epoxy and two alkoxy groups bonded to silicon, and (3) an isocyanurate compound.

Canadian Patent No. 1,287,434 describes adhesion promoters containing (1) an organosilicon compound containing diorganosiloxane, triorganosiloxy, SiO4/2 and alkoxy groups, and (2) a silane containing at least two alkoxy groups and either a glycidoxy or epoxycyclohexyl group bonded to silicon.

Primer compositions containing an epoxy-substituted alkoxy- or acetoxysilane, an organic compound containing unsaturated bonds and a tetraorganotitanate are described in Japanese Laid Open Application No. 79/13,454.

Primer compositions containing an epoxy-functional silane, an aliphatically unsaturated organosilicon compound, a vinyl acetate polymer, platinum or a platinum compound, and an ester type organic solvent are described in U.S. Pat. No. 243,718.

The use of hydrolysis reaction products of 1) a tetraalkoxysilane, 2) an organopolysiloxane containing at least one alkenyl radical or silicon-bonded hydrogen atom and 3) an acryloxy-substituted alkoxysilane as adhesion promoters is taught in U.S. Pat. No. 4,786,701, which issued to U. Tanaka on Nov. 22, 1988.

The use of mixtures containing (1) a silane coupling agent with a acrylate or methacrylate group, (2) an epoxyfunctional silane and (3) a partial allyl ether of a polyhydric alcohol in a silicone adhesive that cures by a platinum catalyzed hydrosilation reaction is taught in U.S. Pat. 5,023,288, which issued to K. Hirai et al. on June 11, 1991.

A disadvantage of many organofunctional organosilicon compounds used as adhesion promoters in prior art organosiloxane compositions, particularly the combination of epoxy- and vinylfunctional organosilicon compounds described in the aforementioned U.S. Pat. 4,087,585, is their adverse effect on the cure rate and completeness of cure, particularly at temperatures below about 120° C. Some integrated circuits and other heat-sensitive electronic devices cannot be exposed to temperatures above this limit even for relatively short periods of time without risking damage to the device.

One objective of this invention is to provide a group of reaction products derived from organosilicon compounds that impart adhesion to curable organosiloxane compositions at curing temperatures below about 100° C.

A second objective of this invention is to provide a class of organosiloxane compositions that cure at temperatures below 100° C. to form adherent coatings on heat-sensitive electronic devices and circuit boards containing these devices.

SUMMARY OF THE INVENTION

The present inventors discovered that the adverse effects of the adhesion promoting additives described in the aforementioned U.S. Pat. No. 4,087,585 on the storage stability, curing properties and/or adhesion of curable organosiloxane compositions can be eliminated when the adhesion promoting additive is a reaction product of (1) an ethylenically unsaturated ether of a polyfunctional alcohol and (2) at least one compound selected from-the group consisting of (i) epoxy-substituted organosilicon compounds containing at least one hydrolyzable group per molecule and (ii) tetraalkyl orthosilicates, also referred to tetraalkoxysilanes. The reaction product is prepared in the presence of a suitable catalyst such as an organotitanium compound.

The adhesion to certain substrates is further improved when the reactants used to prepare the composition include at least one member from both of the present classes of silicon compounds, referred to as i and ii in the preceding paragraph.

DETAILED DESCRIPTION OF THE INVENTION

This invention provides an adhesion-promoting additive for curable organosiloxane compositions, said additive comprising the reaction product of
 (1) a partial ether derived from an ethylenically unsaturated alcohol and a polyhydric alcohol, and
 (2) at least one silicon compound selected from the group consisting of (i) organosilicon compounds containing at least one epoxide group and at least one silicon-bonded hydrolyzable group, and (ii) tetraalkyl orthosilicates, where said reaction product is prepared in the presence of a catalytically effective amount of an organotitanium compound.

This invention also provides curable organosiloxane compositions exhibiting adhesion to both organic and inorganic substrates following curing at temperatures below 100° C., said compositions comprising
 (A) a polyorganosiloxane containing at least two alkenyl radicals per molecule,
 (B) an amount sufficient to cure said composition of an organohydrogensiloxane containing at least two silicon-bonded hydrogen atoms per molecule, where the sum of the alkenyl radicals per molecule of (A) and the silicon-bonded hydrogen atoms per molecule of (B) is greater than 4,
 (C) an amount sufficient to promote curing of said composition of a hydrosilation catalyst selected from the group consisting of metals from the platinum group of the periodic table and compounds of said metals, and
 (D) an amount sufficient to achieve adhesion to substrates in contact with said composition during curing at temperatures below 100° C. of an adhesion promoting additive comprising the reaction product of (1) a partial ether derived from an ethylenically unsaturated alcohol and a polyhydric alcohol, and (2) at one silicon compound selected from the group consisting of (i) organosilicon compounds containing at least one epoxide group and at least one silicon-bonded hydrolyzable group, and (ii) tetraalkyl orthosilicates, where said reaction product is prepared in the presence of a catalytically effective amount of a organotitanium compound.

This invention also provides a method for coating substrates using the present compositions and for adhering two substrates together by applying a layer of the present curable compositions to a surface of at least one of the substrates, placing the coated surface in contact with a surface of a second substrate and maintaining the surfaces in contact during curing of the composition.

The Adhesion Promoting Additive (Ingredient D)

The characterizing feature of the present organosiloxane compositions is the adhesion promoting additive. This additive consists essentially of the product obtained by reacting in the presence of an organotitanium catalyst a partial ether derived from an ethylenically unsaturated alcohol and polyhydric alcohol containing at least one unesterified hydroxyl group (D1) and at least one silicon compound selected from the group consisting of silanes containing (a) at least one epoxysubstituted group that is bonded to silicon through an alkylene radical and (b) at least one hydrolyzable group per molecule (D2), and tetraalkyl orthosilicates (D3).

To achieve adhesion to a wider variety of substrates at lower curing temperatures the ingredients used to prepare the present reaction products preferably include at least one silicon compound from each of the groups identified as D2 and D3, and the reaction products are used in combination with a chelated aluminum compound.

While not wishing to be bound to any theories, it is believed that the active adhesion promoting species are reaction products of the hydroxyl group of the partially etherified polyhydric alcohol with 1) one of the alkoxy or other hydrolyzable groups present on the epoxyfunctional organosilicon compound (D2) and/or one of the alkoxy groups present on the tetraalkyl orthosilicate (D3).

Reactant D1 used to prepare the present adhesion promoting additives is a partial ether derived from an ethylenically unsaturated alcohol and an alcohol defined as polyhydric because the free, i.e unetherified, alcohol contains at least two carbinol ($\equiv$COH) groups. At least one but not all of these carbinol groups is reacted to form an alkenyloxy group such as propenyloxy, also referred to as an allyl ether group. The alkenyloxy group can contain from 3 to 8 or more carbon atoms, and is preferably terminally unsaturated. Allyloxy groups are preferred, based on the availability of the corresponding starting materials.

The polyhydric alcohol can contain from 2 to 10 or more carbon atoms. Preferred polyhydric alcohols include but are not limited to diols such as ethylene and propylene glycols and 1,4-butanediol, triols such as glycerol and trimethylolpropane (3,4-dihydroxymethyl-1-butanol) and compounds containing 4 or more hydroxyl groups, such as pentaerythritol.

The epoxy-substituted organosilicon compound (reactant D2) can be a silane or a polyorganosiloxane. This compound contains at least one epoxy group that is bonded to a silicon atom by means of an alkylene radical containing at least 1 carbon atom. Alternatively, the epoxide group can be part of a carbocyclic ring that is bonded to a silicon atom through an alkylene group. Reactant D2 also contains at least one hydrolyzable group. Reactant D2 is preferably a silane represented by the formula $R^1SiR^2_mR^3_{(3-m)}$ where $R^1$ represents an epoxyalkyl radical or an epoxy-substituted cycloalkyl radical, $R^2$ represents an alkyl radical, $R^3$ represents a hydrolyzable group and m is 0 or 1.

Examples of suitable hydrolyzable groups represented by $R^3$ include but are not limited to alkoxy, carboxy, i.e. R'C(O)O— and ketoximo. In preferred embodiments of ingredient D2 the hydrolyzable groups are alkoxy groups containing from 1 to 4 carbon atoms.

Numerous epoxy-functional silanes are described in U.S. Pat. No. 3,455,877, which is incorporated herein by reference thereto as a disclosure of epoxy-substituted alkoxysilanes that are suitable for use as ingredient D2 of the present compositions.

The epoxy-functional silane is preferably a mono(epoxyhydrocarbyl)trialkoxysilane wherein the carbon atoms of the epoxy group are separated form the silicon atom by an alkylene radical. Most preferably ingredient D2 is a 3-glycidoxypropyltrialkoxysilane where the alkoxy group is methoxy or ethoxy.

Examples of suitable epoxy-substituted silanes include but are not limited to 3-glycidoxypropyltrimethoxysilane and 3,4-epoxycyclohexylmethyltrimethoxysilane.

The second class of silicon compounds used as reactants to prepare the present adhesion additives includes tetraalkyl orthosilicates (D3), also referred to as tetraalkoxysilanes. Examples of suitable compounds include but are not limited to tetramethyl orthosilicate, tetraethyl orthosilicate and tetra-npropyl orthosilicate.

The adhesion-promoting additives of the present invention are prepared by reacting reactant D1 with at least one compound selected from D2 and D3 in the presence of a suitable catalyst that promotes a hydrolysis/condensation reaction involving ingredients D1, D2 and/or D3. The reaction product is believed responsible for the development of adhesion that occurs during curing of the present organosiloxane composition at temperatures no higher than 100° C., preferably below 85° C. The comparative examples that form part of this specification demonstrate that satisfactory adhesion, as determined by the percent cohesive failure between the cured organosiloxane composition and the substrate, is not achieved if the ingredients of the present adhesion promoting additive are not reacted prior to being added to the curable organosiloxane composition.

Irrespective of whether one or both types of reactants D2 and D3 are used to prepare the present adhesion promoting additives, each of the reactants constitutes at least 10 percent of the combined weight of all reactants present. The high level of cohesive failure that characterizes the present compositions is not achieved when this limitation is not observed.

In addition to reactants D1, D2 and/or D3 the reaction mixture used to prepare the present adhesion promoting additives contains an amount of an organotitanium compound sufficient to function as a catalyst for the reaction.

Preferred catalysts for preparing the present adhesion promoting additives are organotitanium compounds such as tetraalkyl titanates and alkyl titanates containing a chelated organic structure such as that derived from 1,3-diketones and beta-keto esters such as actylacetoneates. The chelating agent can be any organic compound capable of forming at least two coordinate bonds with a titanium atom, resulting in a cyclic structure. Preferred chelating agents are 1,3-diketones such as acetylacetone.

The concentration of the organotitanium compound is typically from 0.1 to about 5 weight percent, based on the combined weight of reactants D1, D2 and D3. The use of an excessive amount of organotitanium compound may cause the viscosity of the curable composition to increase during storage.

The Chelated Aluminum Compound

The present adhesion promoting additives optionally include a chelated aluminum compound that has been shown to improved the adhesion between the present compositions and a variety of substrates that the compositions are in contact with during the curing reaction.

The aluminum compounds are derivatives of chelated organic compounds. Suitable chelating agent are discussed in a preceding section of this specification in connection with the organotitanium compound. Preferred chelating agents are 1,3-diketones such as acetylacetone.

The concentration of the chelated aluminum compound is typically from 0.02 to about 0.1 weight percent, preferably about 0.05 weight percent, based on the weight of the curable organosiloxane composition. The use of excessive amounts of the aluminum compound can result in gas evolution during curing of the compositions, which can affect the properties and appearance of the final cured product.

The Alkenyl-Containing Polyorganosiloxane (Ingredient A)

The polyorganosiloxane referred to as ingredient A of the curable organosiloxane compositions of this invention is the principal ingredient of these compositions. This ingredient must contain at least two silicon-bonded alkenyl radicals in each molecule. Suitable alkenyl radicals contain from 1 to about 10 carbon atoms and are exemplified by but not limited to vinyl, allyl and 5-hexenyl. The silicon-bonded organic groups other than alkenyl radicals present in ingredient A are typically monovalent hydrocarbon and halogenated hydrocarbon radicals exemplified by but not limited to alkyl radicals such as methyl, ethyl and propyl; aryl radicals such as phenyl; and halogenated alkyl radicals such as 3,3,3-trifluoropropyl.

The molecular structure of ingredient A is typically linear, however there can be some branching due to the presence of trivalent siloxane units within the molecule. To achieve a useful level of tensile properties in the elastomers prepared by curing the present compositions, the molecular weight of this ingredient should be sufficient to achieve a viscosity at 25° C. greater than about 0.1 Pa.s. The upper limit for the molecular weight of ingredient A is not specifically restricted, and is typically limited only by the processability of the curable organosiloxane composition. The polyorganosiloxanes range from pourable liquids to gum type polymers that are typically characterized by Williams plasticity values.

Preferred embodiments of ingredient A are polydiorganosiloxanes represented by the general formula I

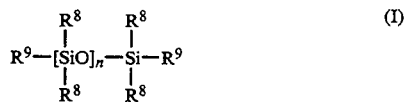

where each $R^8$ is individually selected from monovalent hydrocarbon radicals and monovalent halohydrocarbon radicals, $R^9$ represents a vinyl or other alkenyl radical, and n represents a degree of polymerization equivalent to a viscosity of at least 100 centipoise (0.1 Pa.s), preferably from 0.1 to 10 Pa.s.

The two $R^8$ substituents on each of the silicon atoms in formula I can be identical or different, and can contain from 1 to about 20 carbon atoms. A range of from 1 to 10 carbon atoms is preferred based on the availability of the corresponding monomers. Most preferably at least one of the hydrocarbon radicals on each silicon atom is methyl, and any remainder are vinyl, phenyl and/or 3,3,3-trifluoropropyl, this preference being based on the availability of the reactants typically used to prepare the polydiorganosiloxane and the properties of cured elastomers prepared from these polydiorganosiloxanes. For the same reasons, $R^9$ is preferably vinyl or 5-hexenyl.

Representative embodiments of ingredient A containing ethylenically unsaturated hydrocarbon radicals only at the terminal positions include but are not limited to dimethylvinylsiloxy-terminated polydimethylsiloxanes, dimethylvinylsiloxy-terminated polymethyl-3,3,3-trifluoropropylsiloxanes, dimethylvinylsiloxy-terminated dimethylsiloxane/3,3,3-trifluoropropylmethylsiloxane copolymers and dimethylvinylsiloxy-terminated-dimethylsiloxane/methylphenylsiloxane copolymers.

Methods for preparing ingredient A of the present compositions by hydrolysis and condensation of the corresponding halosilanes or by condensation of the cyclic polydiorganosiloxanes are sufficiently disclosed in the patent and other literature that a detailed description in this specification is not necessary.

For applications requiring high levels of physical properties such as tear strength it may be desirable to include in the curable organosiloxane composition a second polydiorganosiloxane containing ethylenically unsaturated hydrocarbon radicals bonded to both terminal and non-terminal silicon atoms.

The Organohydrogensiloxane (Ingredient B)

The curable organosiloxane compositions of this invention contain at least one organohydrogensiloxane that functions as a crosslinker for ingredient A. In the presence of the hydrosilation catalyst, referred to as ingredient C, the silicon-bonded hydrogen atoms in ingredient B undergo an addition reaction, referred to as hydrosilation, with the silicon-bonded alkenyl groups in ingredient A, resulting in crosslinking and curing of the composition.

Ingredient B must contain at least 2 silicon-bonded hydrogen atoms in each molecule. If ingredient A contains only two alkenyl radicals per molecule, ingredient B must contain an average of more than two silicon-bonded hydrogen atoms to achieve a crosslinked structure in the final cured product. The silicon-bonded organic groups present in ingredient B are selected from the same group of monovalent hydrocarbon and halogenated hydrocarbon radicals as the organic groups of ingredient A, with the proviso that the organic groups in ingredient B must be substantially free of ethylenic or acetylenic unsaturation. The molecular structure of ingredient B can be straight chain, branch-containing straight chain, cyclic, or network.

While the molecular weight of ingredient B is not specifically restricted, viscosities in the range of 3 to 10,000 centipoise (0.003 to 10 Pa.s) at 25 degrees Centigrade are preferred.

The concentration of ingredient B is sufficient to provide a molar ratio of silicon-bonded hydrogen atoms to alkenyl radicals in the curable composition of from 0.5 to 20. A range of from 0.5 to 2 is preferred.

When the curable composition contains less than 0.5 moles of silicon-bonded hydrogen atoms per mole of alkenyl radicals the composition cannot be satisfactorily cured. Bubble formation resulting from the generation of hydrogen gas can occur when the composition contains more than about 20 silicon-bonded hydrogen atoms per alkenyl radical.

The Platinum-Containing Hydrosilation Reaction Catalyst (Ingredient C)

Curing of the present compositions is catalyzed by a hydrosilation catalyst that is a metal from the platinum group of the periodic table or a compound of such a metal. These metals include platinum, palladium and rhodium. Platinum and platinum compounds are preferred based on the high activity level of these catalysts in hydrosilation reactions.

Examples of preferred curing catalysts include but are not limited to platinum black, platinum metal on various solid supports, chloroplatinic acid, alcohol solutions of chloroplatinic acid, and complexes of chloroplatinic acid with liquid ethylenically unsaturated compounds such as olefins and organosiloxanes containing ethylenically unsaturated hydrocarbon radicals bonded to silicon. Complexes of chloroplatinic acid with the aforementioned organosiloxanes containing ethylenically unsaturated hydrocarbon radicals are described in U.S. Pat. No. 3,419,593, which issued to David N. Willing on Dec. 31, 1968. The relevant portions of this patent are incorporated herein by reference as a teaching of preferred catalysts.

The concentration of ingredient C in the present compositions is equivalent to a platinum concentration of from 0.1 to 500 parts by weight of platinum metal, preferably from 1 to 50 parts by weight of platinum metal, per million parts (ppm), based on the combined weight of ingredients A and B.

Curing does not proceed satisfactorily at below 0.1 ppm of platinum, while using more than 500 ppm results in no appreciable increase in cure rate, and is therefore uneconomical.

Optional Ingredients

Platinum catalyst Inhibitor

Mixtures of the aforementioned ingredients A, B and C may begin to cure at ambient temperature. To obtain a longer working time or "pot life", the activity of the catalyst under ambient conditions can be retarded or suppressed by addition of a suitable inhibitor.

Known platinum catalyst inhibitors include the acetylenic compounds disclosed in U.S. Pat. No. 3,445,420, which issued on May 20, 1969 to Kookootsedes et al. Acetylenic alcohols such as 2-methyl-3-butyn-2-ol constitute a preferred class of inhibitors that will suppress the activity of a platinum-containing catalyst at 25° C. Compositions containing these catalysts typically require heating at temperatures of 70° C. or above to cure at a practical rate.

If it desired to increase the pot life of a curable composition under ambient conditions, this can be accomplished using an alkenyl substituted siloxane of the type described in U.S. Pat. No. 3,989,667, which issued on Nov. 2, 1976 to Lee and Marko. Cyclic methylvinylsiloxanes are preferred.

Inhibitor concentrations as low as one mole of inhibitor per mole of platinum will in some instances impart satisfactory storage stability and cure rate. In other instances inhibitor concentrations of up to 500 or more moles of inhibitor per mole of platinum are required. The optimum concentration for a given inhibitor in a given composition can readily be determined by routine experimentation and does not constitute part of this invention.

Some compositions may begin to cure under ambient conditions even when an inhibitor is present. One way to ensure storage stability is to package the ingredients of the curable composition in two or more containers, with the hydrosilation catalyst and the organohydrogensiloxane in separate containers. The contents of the containers are combined when it is desired to cure the composition.

One-part organosiloxane compositions having excellent long-term storage stability at temperature of up to 50° C. or higher can be prepared by first microencapsulating the platinum-containing hydrosilation catalyst in a thermoplastic or thermosetting polymer. Curable organosiloxane compositions containing microencapsulated hydrosilation catalysts are described in U.S. Pat. No. 4,766,176, which issued on Aug. 23, 1988 and U.S. Pat. No. 5,017,654, which issued on May 21, 1991. The teaching of these patents relating to storage stable one-part organosiloxane compositions is incorporated herein by reference. Suitable encapsulants include but are not limited to organosilicon resins and organic resins derived from ethylenically unsaturated hydrocarbons and/or esters of ethylenically unsaturated carboxylic acids such as acrylic and mathacrylic acids.

Reinforcing Fillers

To achieve high levels of tear strength and other physical properties that characterize some types of cured elastomers that can be prepared using the compositions of this invention, it may be desirable to include a reinforcing filler such as finely divided silica. Silica and other reinforcing fillers are often treated with one of more of the known filler treating agents to prevent a phenomenon referred to as "creping" or "crepe hardening" during processing of the curable composition.

Finely divided forms of silica are preferred reinforcing fillers. Colloidal silicas are particularly preferred because of their relatively high surface area, which is typically at least 50 square meters per gram. Fillers having surface areas of at least 300 square meters per gram are preferred for use in the present method. Colloidal silicas can be of the precipitated or a fume type. Both types of silica are commercially available.

The amount of finely divided silica or other reinforcing filler used in the present compositions is at least in part determined by the physical properties desired in the cured elastomer. Liquid or pumpable polyorganosiloxane compositions typically contain from about 10 to about 60 percent by weight of silica, based on the weight of polydiorganosiloxane. This value is preferably from about 30 to about 50 percent.

The filler treating agent can be any of the low molecular weight organosilicon compounds disclosed in the art as being suitable for preventing creping of organosiloxane compositions during processing. The treating agents are typically liquid hydroxyl terminated polydiorganosiloxanes containing an average of from 2 to about 20 repeating units per molecule, and organosilicon compounds such as hexaorganodisiloxanes and hexaorganodisilazanes that hydrolyze under the conditions used to treat the filler to form compounds with silicon-bonded hydroxyl groups. Preferably at least a portion of the silicon bonded hydrocarbon radicals present on the treating agent are identical to a majority of the hydrocarbon radicals present in ingredients A and B. A small amount of water can be added together with the silica treating agent(s) as a processing aid.

It is believed that the treating agents function by reacting with silicon-bonded hydroxyl groups present on the surface of the silica or other filler particles to reduce interaction between these particles.

When a silica filler is used, it is preferably treated in the presence of at least a portion of the other ingredients of the present compositions by blending these ingredients together until the filler is completely treated and uniformly dispersed to form a homogeneous material.

The ingredients that are present during treatment of the filler typically include the silica treating agents and at least a portion of the polydiorganosiloxane(s) referred to herein as ingredient A.

Additional Optional Ingredients

The present organosiloxane compositions can contain one or more additives that are conventionally present in curable compositions of this type to impart or enhance certain physical properties of the cured composition in addition to adhesion or to facilitate processing of the curable composition.

Typical additives include but are not limited to non-reinforcing fillers such as quartz, alumina, mica and calcium carbonate; pigments such as carbon black and titanium dioxide; dyes, flame retardants, and heat and-/or ultraviolet light stabilizers. Resinous organosiloxane copolymers can be used in place of or in combination with one or more reinforcing fillers to improve the physical properties of the cured organosiloxane composition.

A preferred type of resinous copolymer contains repeating units of the general formula $SiO_{4/2}$ in addition to triorganosiloxy units of the general formulae $R^{10}{}_3SiO_{\frac{1}{2}}$ and diorganovinylsiloxy units of the general formula $CH_2=CH(R^{11})_2SiO_{\frac{1}{2}}$. In these formulae $R^{10}$ and $R^{11}$ are individually monovalent hydrocarbon or substituted monovalent hydrocarbon radicals as previously defined for the $R^8$ radicals of ingredient A.

The molar ratio of the combination of triorganosiloxy units and diorganovinylsiloxy units to $SiO_{4/2}$ units in the resinous copolymer is from 0.7 to 1.2, inclusive. The vinyl-containing units constitute from 2 to 8 percent by weight of the copolymer, which preferably contains at least two vinyl radicals per molecule. In preferred embodiments of the copolymer the ranges for the molar ratio of diorganovinylsiloxy: triorganosiloxy:$SiO_{4/2}$ units is 0.08–0.1:0.06–1:1.

The resinous copolymers can be prepared as described in U.S. Pat. No. 2,676,182, which issued to Daudt and Tyler on Apr. 20, 1954 and is hereby incorporated in this specification by reference thereto. The copolymers described in this patent contain from 2 to 23 percent by weight of hydroxyl groups, which is considerably above the maximum level of about 0.8 weight percent preferred for precursors of the present copolymers. The hydroxyl content of the precursor can be conveniently reduced to the desired level by employing a higher concentration of triorganosiloxane units than the concentration range taught by Daudt et al.

Briefly, the method of Daudt et al. comprises reacting a silica hydrosol under acidic conditions with the appropriate amount of hexamethyldisiloxane or trimethylchlorosilane. The resinous copolymers used to prepare the present elastomers can be obtained by reacting Daudt et al's product with the required amount of a hexaorganodisilazane or a hexaorganodisiloxane wherein each silicon atom contains a vinyl radical and two methyl or other hydrocarbon radicals represented by $R^1$ and $R^2$ in the foregoing formula.

Preparation of Curable Compositions

The compositions of this invention can be prepared by combining all of ingredients at ambient temperature. Any of the mixing techniques and devices described in the prior art can be used for this purpose. The particular device used will be determined by the viscosity of the ingredients and the final curable composition. Suitable mixers include but are not limited to paddle type mixers, kneader type mixers and two- and three-roll rubber mills.

Cooling of the ingredients during mixing may be desirable to avoid premature curing of the composition.

The concentration of adhesion-promoting composition required to achieve adequate adhesion between the cured organosiloxane composition and a substrate is dependent upon a number of variables, including but not limited to the reactants present in the curable composition, the substrate to which adhesion is desired, and the conditions under which adhesion is to be maintained. For many end-use applications adequate adhesion can be achieved when the adhesion-promoting composition constitutes from 0.5 to 2 percent of the total weight of the curable organosiloxane composition. When the curable compositions are used as adhesives or coatings for electronic devices the concentration of adhesion-promoting additive is about 1 weight percent.

To maximize storage stability the curable compositions are preferably kept in closed containers until used. If greater storage stability is desired, the compositions can be packaged in two or more containers with the organohydrogensiloxane (ingredient B) and the platinum group metal catalyst in separate containers.

Depending upon the types and concentrations of ingredients A and B, cured organosiloxane materials prepared using the present compositions can vary in properties from brittle resins to elastomers to gels, and are useful in a variety of end-use applications as coatings or as molded or extruded articles. Unfilled materials are particularly useful as adhesives, protective coatings, encapsulants and potting compositions for protecting delicate electronic devices such as transistors and integrated circuits from damage by moisture and other materials present in the environment that can adversely affect operation of the device. The compositions can be used to coat either the individual devices or a circuit board containing a number of these devices together with other electronic components.

The present compositions can be applied to substrates by spraying, dipping, extrusion or by the use of a brush, roller or coating bar. The selection of a particular application method will be determined at least in part by the viscosity of the curable composition. The viscosity of the composition can be reduced using suitable solvents or reactive diluents as known in the art.

Curing of the present compositions commences when ingredients A, B and C are combined. One advantage of the present adhesion promoting compositions is the absence of substantial retardation of the curing reaction. A second advantage of these compositions is their ability to cohesively bond to a variety of organic and inorganic substrates at curing temperatures as low as 25° C. The compositions are therefore suitable for application to substrates that cannot withstand the elevated temperatures of 100° C. or higher required to cure organosiloxane compositions containing prior art adhesion promoters such as epoxide compounds that inhibit platinum group metal catalysts.

Preferred compositions cure over a period of several hours under ambient conditions. As is true for other compositions that cure by a platinum-catalyzed hydrosilation reaction, curing can be accelerated by heating. Curing temperatures of from 25° to about 80° C. are preferred.

EXAMPLES

The following examples describes preferred one-part curable compositions of the present invention and should not be interpreted as limiting the scope of the invention defined in the accompanying claims. Unless otherwise specified all parts and percentages in the example are by weight and viscosities were measured at 25° C.

Example 1

This example demonstrates the high level of adhesion imparted by the present additives.

Curable compositions were prepared by blending the following ingredients to homogeneity.

as ingredient A, 98 parts of a dimethylvinylsiloxy-terminated polydimethylsiloxane having a viscosity of about 0.4 Pa.s;

as ingredient B, 6 parts of a trimethylsiloxy-terminated polydiorganosiloxane having an average of five methylhydrogensiloxane units and three dimethylsiloxane units per molecule with a silicon-bonded hydrogen atom content in the range from about 0.7 to 0.8 weight percent as ingredient C, 0.2 part of a reaction product of hexachloroplatinic acid and sym-tetramethyldivinyldisiloxane that had been diluted with a liquid dimethylvinylsiloxy terminated polydimethylsiloxane in an amount sufficient to achieve a platinum content of 0.7 weight percent 93 parts of a finely divided quartz;
0.9 part of zinc oxide;
0.5 part of carbon black;

as the hydrosilation catalyst inhibitor, 0.5 part of cyclic methylvinylsiloxanes;

0.05 part of aluminum acetylacetonate; and 2 parts adhesion promoting additive.

Three adhesion promoting additives of the present invention were prepared by heating mixtures of reactants for 2 hours at 80° C. The resultant mixtures were then heated under reduced pressure to remove volatile materials. The reactants were the diallyl ether of trimethylolpropane (D1), 3-glycidoxypropyltrimethoxysilane (D2), tetraethyl orthosilicate (D3) and 1.5 parts of tetrabutyl titanate. The parts by weight of the reactants and the temperature and pressure used to remove volatile materials from the resultant adhesion promoting additive are recorded in Table 1.

TABLE 1

| Additive No. | D1 | D2 | D3 | Temp. (°C.) | Pressure (mm Hg) |
|---|---|---|---|---|---|
| 1 | 50 | 50 | 50 | 90 | 90 |
| 2 | 50 | 0 | 100 | 80 | 100 |
| 3 | 50 | 107 | 0 | 90 | 80 |

All additives were prepared using 1.5 parts of tetrabutyl titanate.

The substrates on which the curable compositions were evaluated were strips of material measuring 1×4 inches (2.5×10 cm.). The materials were aluminum, copper, glass and FR4 type printed circuit board. The strips were cleaned by rubbing them for ten strokes with a cheesecloth that had been soaked in methyl isobutyl ketone and the allowing the substrates to dry under ambient conditions. Test samples were prepared using two strips of a substrate separated by a 1/16 inch (1.6 mm)-thick Teflon(R) spacer containing a ½ inch (1.3 cm)-diameter hole in its center.

The spacer was placed in the center of one of the strips and the hole was filled with a curable composition containing one of the three adhesion promoting additives. A second strip of the same material was then placed on top of the spacer such that its longitudinal axis was perpendicular with respect to the longitudinal axis of the lower strip. The resulting composite was clamped together and the organosiloxane composition in the spacer was cured by heating the composite for 2 hours at 70° C. Each strip was then placed in the one of the jaws of a tensionometer and the composite was subjected to sufficient force (F) to pull the strips apart. The extent of cohesive failure (%CF) was determined by observing the percentage of the substrate area to which cured composition adhered relative to the area that had been in contact with the curable composition. The results are recorded in Table 2.

TABLE 2

| Additive No. | Substrate | % CF/F (MPa) | | |
|---|---|---|---|---|
| | Al | Cu | FR4 | Glass |
| 1 | 100/1.6 | 100/1.6 | 100/1.6 | 100/1.3* |
| 2 | 100/1.4 | 10/1.2 | 100/1.4 | 100/1.4* |
| 3 | 100/1.3 | 100/1.3 | 100/1.3 | 100/1.4* |

*The glass substrate failed prior to the cured composition

The data in Table 2 indicate that the three adhesion promoting additives imparted equivalent degrees of adhesion at a cure temperature of 70° C. All samples exhibited 100 percent cohesive failure and similar adhesive strengths (F values).

Example 2

This example demonstrates the superior adhesion at lower curing temperatures achieved using adhesion promoting additives prepared using both an epoxy-substituted organosilicon compound (reactant D2) and a tetraalkyl orthosilicate (reactant D3).

Curable organosiloxane compositions were prepared and evaluated for adhesion as described in Example 1, with the exception that the compositions were cured for 2 hours at 50° C. Some of the samples were tested the same day, and others were allowed to remain under ambient conditions for up to eight days, during which they were evaluated. The time interval between curing and testing and the test results are recorded in Table 3.

TABLE 3

| Days Following Curing | % CF/F (MPa) | | | |
|---|---|---|---|---|
| | Substrate = Al | Cu | FR4 | Glass |
| Additive No. 1 | | | | |
| 1 | 100/1.4 | 0/1.2 | 100/1.1 | 0/0.4 |
| 2 | 100/1.3 | 0/0.97 | 100/1.5 | 100/1.3 |
| 5 | 100/1.6 | 100/1.4 | 100/1.4 | 100/1.5 |
| 8 | 100/1.3 | 100/1.1 | 100/1.1 | 100/1.3 |
| Additive No. 2 | | | | |
| 1 | 0/0.7 | 0/0.5 | 0/0.6 | 40/1.2 |
| 2 | 0/1.0 | 0/0.1 | 0/0.5 | 100/1.2 |
| 4 | 0/0.5 | 0/0.8 | 0/0.9 | 100/1.3 |
| 7 | 0/0.9 | 0/0.5 | 0/0.7 | 100/1.1 |
| Additive No. 3 | | | | |
| 1 | 0/0.7 | 0/0.2 | 0/0.5 | 0/0.3 |
| 2 | 0/0.3 | 0/0.7 | 0/1.2 | 0/0.6 |
| 4 | 0/0.03 | 0/0.6 | 100/1.2 | 0/0.3 |
| 7 | 0/0.1 | 0/0.1 | 20/1.2 | 0/0.6 |

Additive 2 did not achieve adhesion to aluminum, copper or FR4 board at a cure temperature of 50° C. even after aging. Adhesion additive 3 did not adhere to any of the substrates. Only additive 1, which was prepared using reactants D1, D2 and D3 exhibited 100 percent cohesive failure to all substrates, both immediately after being cured at 50° C. and following aging.

Example 4

This example demonstrates the requirement for pre-reacting the ingredients of the present adhesion promoting additives prior to blending them into a curable organosiloxane composition.

Curable compositions and test samples were prepared as described in Example 1, with the exception that reactants D1, D2, D3 and the tetrabutyl titanate were not reacted prior to being added to the other ingredients of the curable organosiloxane compositions, which were then cured for 2 hours at 50° C. The results of the adhesion evaluation are summarized in Table 5. Some of the cured samples were allowed to age under ambient conditions as described in the preceding examples prior to being evaluated.

TABLE 5

| | Unreacted Ingredients of Additive No. 1 | | | |
|---|---|---|---|---|
| Days Following | % CF/F (MPa) | | | |
| Curing @ 50° C. | Substrate = Al | Cu | FR4 | Glass |
| 1 | 0/0.8 | * | * | 40/0.8 |
| 2 | 0/0.9 | * | * | 10/0.7 |
| 4 | 0/0.9 | * | 0/0.3 | 75/1.0 |
| 7 | 60/0.9 | * | 20/0.4 | 75/1.0 |

* = Composition did not cure

The data in Table 5 demonstrate that in addition to not exhibiting the degree of adhesion achieved by compositions containing the pre-reacted ingredients of the present adhesion promoters (viz Table 2), the presence of these unreacted ingredients inhibits curing of compositions on copper and FR4 printed circuit boards.

Example 5

This example demonstrates the effect of pre-reaction on the ingredients of an adhesion promoter composition of this invention relative to an adhesion promoter composition containing 3-methacryloxypropyltrimethoxysilane in place of an ethylenically unsaturated ether of a polyhydric alcohol.

Curable compositions were prepared using the ingredients described in Example 1 and adhesion promoters D1, D2, n-propyl orthosilicate as the alkyl orthosilicate ingredient (D3'), and tetrabutyl titanate. Ingredient D1 was replaced with 3-methacryloxypropyltrimethoxysilane (MPTMS) in the comparative example.

The parts by weight of the adhesion promoting additives and the temperature and pressure used to remove volatile materials from the resultant pre-reacted additive are recorded in Table 1. For comparative purposes the same amounts of adhesion promoting additives were added directly to the other ingredients of the curable composition without being pre-reacted.

TABLE 6

| Additive No. | D1 | D2 | D3' | MPTMS | Temp. (°C.) | Pressure (mm Hg) |
|---|---|---|---|---|---|---|
| 1 | 0.29 | 0.98 | 0.87 | 0 | 90 | 90 |
| 2* | 0 | 0.25 | 1.1 | 0.15 | 90 | 87 |

* = Comparative Example

Additive 1 contained 0.04 part of tetrabutyl titanate and additive 2 contained 0.1 part of this catalyst.

Curable organosiloxane compositions were prepared and evaluated for adhesion as described in Example 1, with the exception that the compositions were cured for 4 days and 7 days at 25° C., the force required to separate the substrates was measured in kilograms, and not all of the compositions contained aluminum acetylacetonate (AlAcAc). This catalyst was used at a concentration of 0.05 percent, based on the weight of the curable composition. The cure times and the test results are recorded in Table 7. %CF represents the percent cohesive failure, i.e. the percentage of the substrate surface to which the curable composition adhered following separation of the substrates, and the force required to achieve this separation is reported in kilopascals. The substrates used for this evaluation were aluminum, copper, FR4 board and glass.

TABLE 7

| | % CF/F (KPa) | | | |
|---|---|---|---|---|
| Days @ 25° C. | Al | Cu | FR4 | Glass |
| Additive No. 1 (Pre-Reacted) | | | | |
| 4 (no AlAcAc) | 0/139.5 | 0/179.4 | 100/260.3 | 0/247.1 |
| 7 (no AlAcAc | 0/136.1 | 0/68.4 | 100/255.2 | 0/110.5 |
| 7 (w. AlAcAc) | 100/169.9 | 100/197.0 | 100/230.1 | 100/344.1 |
| Additive No. 1 (Not Pre-Reacted) | | | | |
| 4 (no AlAcAc) | 0/33.5 | 0/72.6 | 0/231 | 0/98.4 |
| 7 (no AlAcAc | 0/25.8 | 0/89.3 | 100/279 | 0/129.1 |
| 7 (w. AlAcAc) | 90/186.7 | 0/170.6 | 75/174.8 | 100/274.1 |
| Additive No. 2* (Pre-Reacted) | | | | |
| 4 (no AlAcAc) | 0/114.5 | 0/62.1 | 100/13.7 | 0/76.7 |
| 7 (no AlAcAc | 0/98.4 | 0/56.5 | 0/167.8 | 0/105.6 |
| 7 (w. AlAcAc) | 50/25.3 | 0/107.7 | 100/204.9 | 0/125.8 |
| Additive No. 2* (Not Pre-Reacted) | | | | |
| 4 (no AlAcAc) | 0/143.8 | 0/161.2 | 0/235.2 | 0/129.1 |
| 7 (no AlAcAc | 0/96.3 | 0/161.2 | 50/234.3 | 0/152.4 |
| 7 (w. AlAcAc) | 10/200 | 0/207 | 100/180.4 | 100/230.8 |

The data in Table 7 demonstrate that after curing for 4 days at 25° C. without aluminum acetylacetonate, compositions containing the pre-reacted adhesion promoting ingredients of this invention (additive no. 1) had better adhesion than the composition containing the same adhesion promoting ingredients that had not been pre-reacted.

Under the same conditions compositions containing the unreacted ingredients of the comparative adhesion additive (additive no. 2) had better adhesion than the composition containing the same adhesion promoting ingredients that had been pre-reacted.

The data also demonstrate the beneficial effect of aluminum acetylacetonate in improving the adhesion imparted by the present pre-reacted adhesion promoting additives (100% cohesive failure on all substrates). The corresponding composition containing the unreacted adhesion promoting ingredients achieved 100% cohesive failure only to glass.

Only on FR4 board did the comparative adhesion promoter containing reacted ingredients achieve 100 percent cohesive failure, with better bond strength than the corresponding composition in which the adhesion promoting ingredients had not been pre-reacted. The composition containing the unreacted adhesion promoting ingredients had 100% cohesive failure on all four substrates with higher bond strength to aluminum, copper and glass.

That which is claimed is:

1. An adhesion-promoting additive for curable organosiloxane compositions, said additive comprising the reaction product of
   (1) a partial ether derived from an ethylenically unsaturated alcohol and a polyhydric alcohol, and
   (2) at least one organosilicon compound containing at least one epoxide group and at least one silicon-bonded hydrolyzable group, and
   (3) at least one tetraalkyl orthosilicate;
   wherein said reaction product is prepared in the presence of a catalytically effective amount of an organotitanium compound.

2. An additive according to claim 1 where the terminal carbon atoms of said unsaturated alcohol are unsaturated; said polyhydric alcohol contains from 2 to 10 carbon atoms; said organosilicon compound corresponds to the formula $R^1SiR^2_mR^3_{(3-m)}$, wherein $R^1$ represents an epoxyalkyl radical or an epoxy-substituted cycloalkyl radical, $R^2$ represents an alkyl radical, $R^3$ represents a hydrolyzable group and m is 0 or 1, and said tetraalkyl orthosilicate is selected from the group consisting of tetramethyl orthosilicate, tetraethyl orthosilicate and tetra-npropyl orthosilicate.

3. An additive according to claim 2 where $R^3$ is alkoxy, carboxy or ketoximo, said unsaturated alcohol is allyl alcohol, said polyhydric alcohol is selected from the group consisting of ethylene glycol, propylene glycol, glycerol, trimethylolpropane and pentaerythritol, said organosilicon compound and said tetraalkyl silicate each constitute at least 20 weight percent of the reactants used to prepare said additive, the organotitanium compound constitutes from 0.1 to 5 percent of the combined weight of the reactants used to prepare said additive, and said additive further comprises a chelated aluminum compound.

4. An additive according to claim 3 where said ether is a diallyl ether of trimethylolpropane, said organosilicon compounds are monoepoxytrialkoxysilanes wherein $R^1$ is 3-glycidoxypropyl or epoxycyclohexylmethyl and said tetraalkyl orthosilicate is tetramethyl orthosilicate or tetraethyl orthosilicate.

5. An additive according to claim 4 where the organosilicon compound is 3-glycidoxypropyltrimethoxysilane.

6. A curable organosiloxane composition exhibiting adhesion to both organic and inorganic substrates following curing at temperatures below 100° C., said composition comprising
   (A) a polyorganosiloxane containing at least two alkenyl radicals per molecule,
   (B) an amount sufficient to cure said composition of an organohydrogensiloxane containing at least two silicon-bonded hydrogen atoms per molecule, where the sum of the alkenyl radicals per molecule of (A) and the silicon-bonded hydrogen atoms per molecule of (B) is greater than 4,
   (C) an amount sufficient to promote curing of said composition of a hydrosilation catalyst selected from the group consisting of metals from the platinum group of the periodic table and compounds of said metals, and
   (D) an amount sufficient to achieve adhesion to substrates in contact with said composition during curing at temperatures below 100° C. of an adhesion promoting additive comprising the reaction product of
      (1) at least one partial ether derived from an ethylenically unsaturated alcohol and a polyhydric alcohol,
      (2) at least one organosilicon compound containing at least one epoxide group and at least one silicon-bonded hydrolyzable group, and
      (3) at least one tetraalkyl orthosilicate, wherein said reaction product is prepared in the presence of a catalytically effective amount of an organotitanium compound.

7. A composition according to claim 6 where the terminal carbon atoms of said unsaturated alcohol are unsaturated; said polyhydric alcohol contains from 2 to 10 carbon atoms; said organosilicon compound corresponds to the formula $R^1SiR^2_mR^3_{(3-m)}$, where $R^1$ represents an epoxyalkyl radical or an epoxy-substituted cycloalkyl radical, $R^2$ represents an alkyl radical, $R^3$ represents a hydrolyzable group and m is 0 or 1, said tetraalkyl orthosilicate is selected from the group consisting of tetramethyl orthosilicate, tetraethyl orthosilicate and tetra-n-propyl orthosilicate; said curable polyorganosiloxane is a polydiorganosiloxane corresponding to the formula

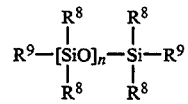

where each $R^8$ is individually selected from the group consisting of monovalent hydrocarbon radicals and monovalent halohydrocarbon radicals, $R^9$ represents an alkenyl radical, and n represents a degree of polymerization equivalent to a viscosity of at least 0.1 Pa.s; and said hydrosilation catalyst is a platinum compound and is present at a concentration equivalent to from 0.1 to 500 parts by weight of platinum per million parts, based on the combined weight of said polyorganosiloxane and said organohydrogensiloxane.

8. A composition according to claim 7 where said adhesion promoting additive constitutes from 0.5 to 2 percent of the total weight of said curable composition.

9. A composition according to claim 8 where said $R^3$ is alkoxy, carboxy or ketoximo, said unsaturated alcohol is allyl alcohol, said polyhydric alcohol is selected from the group consisting of ethylene glycol, propylene glycol, glycerol, trimethylolpropane and pentaerythritol, said organosilicon compound and said tetraalkyl silicate each constitute at least 20 weight percent of the reactants used to prepare said additive, the organotitanium compound constitutes from 0.1 to 5 percent of the combined weight of the reactants used to prepare said additive, said additive further comprises a chelated aluminum compound, said additive constitutes 1 percent of the total weight of said composition, $R^8$ is methyl, $R^9$ is vinyl or 5-hexenyl, the viscosity of said polydiorganosiloxane is from 0.1 to 10 Pa.s, the viscosity of said organohydrogen-siloxane is from 0.003 to 10 Pa.s and the molar ratio of silicon-bonded hydrogen atoms in said organohydrogensiloxane to $R^9$ radicals in said polydiorganosiloxane is from 0.5 to 20.

10. A composition according to claim 9 where said partial ether is a diallyl ether of trimethylolpropane, said silicon compound is a monoepoxytrialkoxysilane wherein the epoxy group is selected from the group consisting of 3-glycidoxypropyl and epoxycyclohexylmethyl, and said molar ratio is from 0.5 to 2.

11. A composition according to claim 10 where said silicon compound is 3-glycidoxypropyltrimethoxysilane and said tetraalkyl orthosilicate is tetramethyl orthosilicate or tetraethyl orthosilicate.

12. A composition according to claim 11 where said composition is packaged in at least two containers with said organohydrogensiloxane and said hydrosilation catalyst located in separate containers.

13. A method for bonding two substrates, the method comprising the sequential steps of
(I) applying to a surface of one of said substrates a curable organosiloxane composition comprising
  (A) a polyorganosiloxane containing at least two alkenyl radicals per molecule,
  (B) an amount sufficient to cure said composition of an organohydrogensiloxane containing at least two silicon-bonded hydrogen atoms per molecule, where the some of the alkenyl radicals per molecule of (A) and the silicon-bonded hydrogen atoms per molecule of (B) is greater than 4,
  (C) an amount sufficient to promote curing of said composition of a hydrosilation catalyst selected from the group consisting of metals from the platinum group of the periodic table and compounds of said metals, and
  (D) an amount sufficient to achieve adhesion to substrates in contact with said composition during curing at temperatures below 100° C. of an adhesion promoting additive comprising the reaction product of
    (1) at least one partial ether derived from an ethylenically unsaturated alcohol and a polyhydric alcohol,
    (2) at one organosilicon compound containing at least one epoxide group and at least one silicon-bonded hydrolyzable group, and
    (3) at least one tetraalkyl orthosilicate, wherein said reaction product is prepared in the presence of a catalytically effective amount of an organotitanium compound;
(II) placing the surface coated with said composition in contact with a surface of a second substrate and
(III) curing said organosiloxane composition.

14. A method according to claim 21 where the terminal carbon atoms of said ethylenically unsaturated alcohol are unsaturated; said polyhydric alcohol contains from 2 to 10 carbon atoms; said organosilicon compound corresponds to the formula $R^1SiR^2_mR^3_{(3-m)}$, where $R^1$ represents an epoxyalkyl radical or an epoxy-substituted cycloalkyl radical, $R^2$ represents an alkyl radical, $R^3$ represents a hydrolyzable group and m is 0 or 1, said tetraalkyl orthosilicate is selected from the group consisting of tetramethyl orthosilicate, tetraethyl orthosilicate and tetra-npropyl orthosilicate; said polyorganosiloxane is a polydiorganosiloxane corresponding to the formula

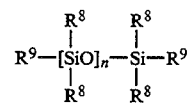

where each $R^8$ is individually selected from monovalent hydrocarbon radicals and monovalent halohydrocarbon radicals, $R^9$ represents an alkenyl radical, and n represents a degree of polymerization equivalent to a viscosity of at: least: 0.1 Pa.s and said hydrosilation catalyst is a platinum compound and is present at a concentration equivalent to from 0.1 to 500 parts by weight of platinum per million parts, based on the combined weight of said polyorganosiloxane and said organohydrogensiloxane, and said composition is cured at a temperature of from 25° to 70° C.

15. A method according to claim 14 where said adhesion promoting additive constitutes from 0.5 to 2 percent of the total weight of said curable composition.

16. A method according to claim 15 where said $R^3$ is alkoxy, carboxy or ketoximo, said ether is an allyl ether, said polyhydric alcohol is selected from the group consisting of ethylene glycol, propylene glycol, glycerol, trimethylolpropane and pentaerythritol, said organosilicon compound and said tetraalkyl silicate each constitute at least 20 weight percent of the reactants used to prepare said additive, the organotitanium compound constitutes from 0.1 to 5 percent of the combined weight of the reactants used to prepare said additive, said additive further comprises a chelated aluminum compound, said additive constitutes 1 percent of the total weight of said composition, $R^8$ is methyl, $R^9$ is vinyl or 5-hexenyl, the viscosity of said polydiorganosiloxane is from 0.1 to 10 Pa.s, the viscosity of said organohydrogen-siloxane is from 0,003 to 10 Pa.s and the molar ratio of silicon-bonded hydrogen atoms in said organohydrogensiloxane to $R^9$ radicals in said polydiorganosiloxane is from 0.5 to 20.

* * * * *